United States Patent [19]

Müller et al.

[11] Patent Number: 4,742,325

[45] Date of Patent: May 3, 1988

[54] THIN-FILM CIRCUIT AND METHOD OF MAKING THE SAME

[75] Inventors: Siegfried Müller; Helmut Hanisch, both of Nürtingen, Fed. Rep. of Germany

[73] Assignee: Standard Elektrik Lorenz AG, Stuttgart, Fed. Rep. of Germany

[21] Appl. No.: 17,215

[22] Filed: Feb. 20, 1987

[30] Foreign Application Priority Data

Feb. 20, 1986 [DE] Fed. Rep. of Germany ....... 3605425

[51] Int. Cl.⁴ .......................................... H01C 1/012
[52] U.S. Cl. ................................... 338/309; 338/308; 338/322; 338/327
[58] Field of Search ............................... 338/307–309, 338/313, 322, 324, 327

[56] References Cited

U.S. PATENT DOCUMENTS

| 3,649,945 | 3/1972 | Waits | 338/309 |
| 4,025,404 | 5/1977 | Joly et al. | 338/309 X |
| 4,358,748 | 11/1982 | Gruner et al. | 338/25 |

FOREIGN PATENT DOCUMENTS 0005842 2/1980 Japan .................................. 338/309

Primary Examiner—C. L. Albritton
Attorney, Agent, or Firm—Spencer & Frank

[57] ABSTRACT

A thin-film circuit including integrated resistors and conductors. The conductors consist of two superposed Au layers having a Pd layer sandwiched between them. The conductors have a sheet resistivity of R 10 m and are solderable and bondable. The thin-film circuit is suitable for applications in the GHz range.

4 Claims, 2 Drawing Sheets

THIN-FILM CIRCUIT AND METHOD OF MAKING THE SAME

BACKGROUND OF THE INVENTION

The present invention relates to a thin-film circuit with integrated resistors and conductors and to a method of making the same.

In the journal "Electrical Design News", Nov. 25, 1981, pp. 141 et seq., a thin-film circuit is described in which a patterned NiCr layer is deposited on a ceramic substrate to form integrated resistors. Disposed over the patterned NiCr layer are a patterned Ni layer as a diffusion barrier and a patterned Au layer for the conductors.

If conventional tin-lead soldered joints are to be made to such gold conductors, the layer thickness of the conductors should not exceed 1.5 $\mu$m, because the gold layer is partially dissolved by the molten solder and forms an alloy with the solder. If the percentage of gold in the alloy exceeds a given limit, the alloy becomes brittle. The percentage of gold increases with increasing layer thickness of the gold conductors. Mechanical stress, which may be caused, for example, by temperature changes, tends to result in the formation of cracks which originate from the brittle lead-tin-gold alloy. The risk of cracking increases with increasing layer thickness of the gold conductors.

If a thin-film circuit is to be suitable for use in the GHz range, only conductors with a very low sheet resistivity ($R_F \leq 10m$) can be employed.

Since the width of the conductors strongly influences the capacitance between two adjacent conductors, the sheet resistivity is advantageously reduced by increasing the layer thickness, the required layer thicknesses ranging from 6 $\mu$m to 10 $\mu$m. Gold conductors of this layer thickness which are soldered with lead-tin solders exhibit no sufficient mechanical strength.

SUMMARY OF THE INVENTION

One object of the present invention is to provide a thin-film circuit of the above kind which is suitable for use in the GHz range and whose conductors have a sheet resistivity of $R_F \leq 10m$, the conductors being both bondable and solderable with common lead-tin solders.

BRIEF DESCRIPTION OF THE DRAWING

An embodiment of the invention and a method of making the thin-film circuit will now be described in more detail with reference to the accompanying drawings, in which.

DETAILED DESCRIPTION

Figure 1:
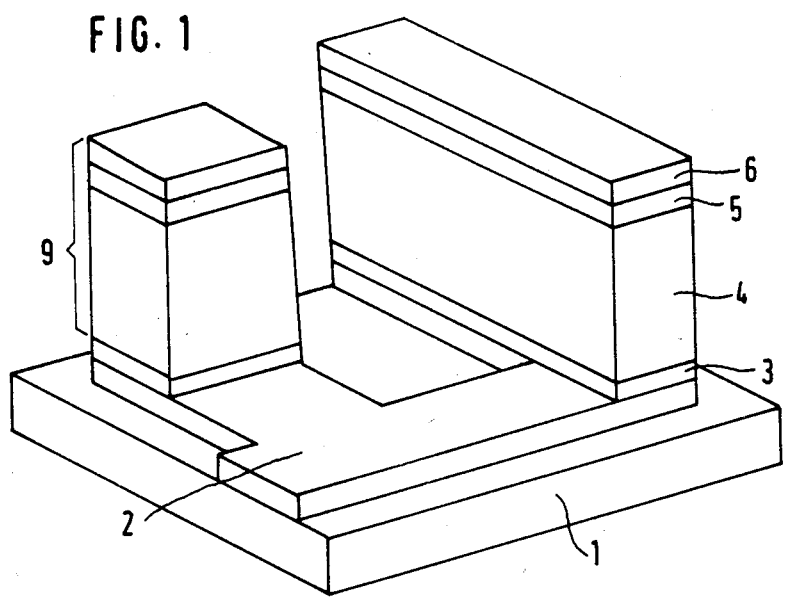
FIG. 1 is a perspective view of an embodiment of the layer structure of a thin-film circuit in accordance with the invention.

The embodiment relates to the layer structure of a thin-film circuit in accordance with the invention. FIG. 1 shows a representative part of a thin-film circuit which contains conductors and resistors. A complete thin-film circuit is constructed from such conductors and resistors and is patterned as required. Connections are made to the top layer of the conductive layers by bonding or soldering.

FIG. 1 shows the structure of the thin-film circuit according to the invention in a perspective view. An $AL_2O_3$ substrate 1 supports a patterned NiCr layer 2, which forms the integrated resistors with a sheet resistivity of, e.g., $R_F = 100$. The thickness of the NiCr layer 2 ranges from 30 nm to 50 nm, and the width from 50 $\mu$m to 100 $\mu$m, depending on the intended use of the thin-film circuit. Those areas of the NiCr layer 2 which intersect with the conductive layers are covered with an Ni layer 3 of thickness d=0.3 $\mu$m, which acts as a diffusion barrier. The Ni layer 3 is coated with a lower Au layer 4 having a thickness of 2 $\mu$m$\leq$d$\leq$10 $\mu$m. As an alloying barrier, a Pd layer 5 is disposed over the lower Au layer 4. On the Pd layer 5 is an upper Au layer 6. The pd layer 5 and the upper Au layer 6 each have a thickness of d=1 $\mu$m. The lower Au layer 4, the Pd layer 5, and the upper Au layer 6 form the conductive layers 9.

The sheet resistivity of the conductive layers 9 is $R \leq 10$ m and, if the width of the conductive layers 9 is fixed, is varied by changing the thickness of the lower Au layer 4. The diffusion barrier prevents Au atoms from the lower Au layer 4 from penetrating into the NiCr layer 2, thus preventing any change in the electrical resistance of the NiCr layer 2. The allowing barrier permits the conductive layers 9 to be soldered with common lead-tin solder without this resulting in the formation of a brittle alloy. The thickness of the upper gold layer is chosen so that no brittle alloy can form during soldering with common lead-tin solders. The presence of the upper Au layer 6 is necessary if the conductive layers are to be not only solderable but also bondable.

Instead of the Pd layer 5, an Ni layer or a Pt layer can be used as the alloying barrier, but both these layers have disadvantages in comparison with the Pd layer 5. The Pt layer entails great expense because of the high material cost. The Ni layer is chemically attacked during the manufacturing process and thus undercut, which results in mechanical weakening of the conductive layers 9. Instead of the $AL_2O_3$ substrate 1, other commonly used substrates can be used, such as glass substrates. The material of the resistive layer can also be tantalum nitride in the form of $Ta_2N$ or TaN.

A method of making the thin-film circuit in accordance with the invention will be described in the following.

Figure 2:
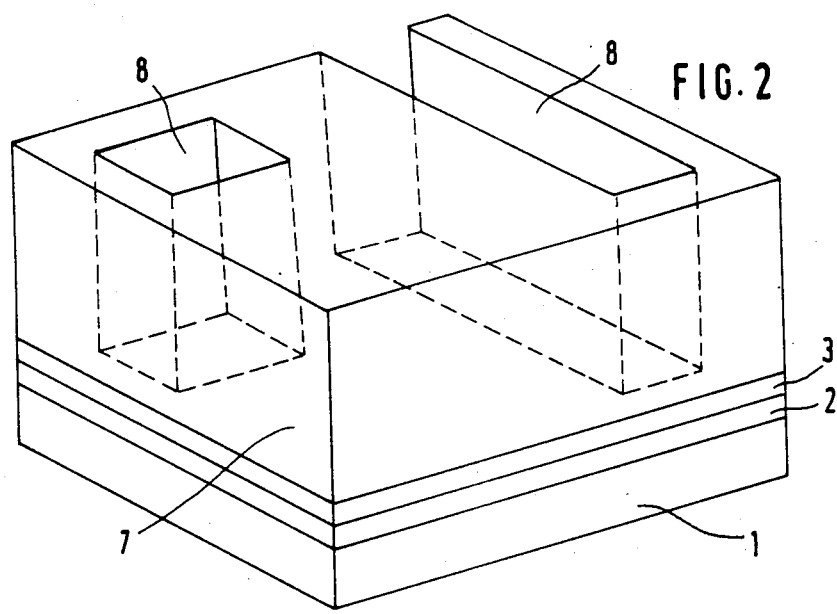
FIG. 2 shows the embodiment of FIG. 1 prior to the deposition of the conductive layers.
Figure 3:
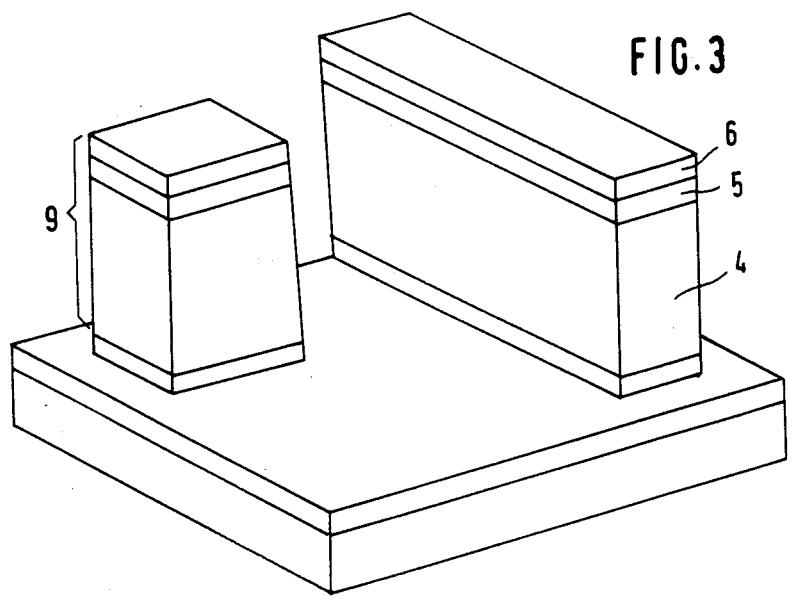
FIG. 3 shows the embodiment of FIG. 1 prior to the patterning of the resistive layer.

An NiCr layer 2 is deposited on the $AL_2O_3$ substrate 1 by vacuum evaporation or sputtering. On the NiCr layer 2, an Ni layer 3 is formed by vacuum evaporation or sputtering, too. In the next step, a photoresist mask 7 is applied (FIG. 2) which leaves open spaces 8 in those areas where the conductive layers 9 are to be formed. The thickness d of the photoresist layer is 4 $\mu$m$\leq$d$\leq$12 $\mu$m, depending on the desired thickness of the lower Au layer. If necessary, the photoresist mask is deposited in several layers. Then, first the Lower Au layer 4, then the Pd layer 5, and finally the upper Au layer 6 are removed, and the part of the Ni layer 3 which is not covered by the conductive layers 9 is etched away. This step of the embodiment is illustrated in FIG. 3. Finally, the NiCr layer is patterned using photolithographic techniques to define the integrated resistors (FIG. 1).

The description of the method clearly shows the advantage a Pd layer 5 has over an Ni layer as an alloying barrier: during the etching of the Ni layer 3, part of an alloying barrier of Ni would be removed.

What is claimed is:

1. A thin-film circuit with integrated resistors and conductors, comprising:
   a substrate;
   a patterned resistive layer; and
   a patterned multilayer arrangement comprising a diffusion barrier and conductive layers, said conductive layers comprising a lower gold layer, an alloying barrier, and an upper gold layer.

2. A thin-film circuit as claimed in claim 1, wherein: said lower gold layer is thicker than 2 μm.

3. A thin-film circuit as claimed in claim 2, wherein: said alloying barrier is a Pd layer.

4. A thin-film circuit as claimed in claim 1, wherein:
   said substrate is an $AL_2O_3$ substrate;
   said resistive layer an NiCr layer;
   said diffusion barrier is an Ni layer; and
   the thickness of said lower Au layer ranges between 2 μm and 10 μm, that of said Pd layer between 0.3 μm and 1 μm, and that of said upper Au layer between 0.5 μm and 1.5 μm.

* * * * *